United States Patent [19]
Woods

[11] Patent Number: 6,011,446
[45] Date of Patent: Jan. 4, 2000

[54] RF/MICROWAVE OSCILLATOR HAVING FREQUENCY-ADJUSTABLE DC BIAS CIRCUIT

[75] Inventor: Donnie W. Woods, Thousand Oaks, Calif.

[73] Assignee: Delphi Components, Inc., Newbury Park, Calif.

[21] Appl. No.: 09/082,805

[22] Filed: May 21, 1998

[51] Int. Cl.[7] ............................. H03B 5/18; H03F 3/60; H01P 1/203
[52] U.S. Cl. ................. 331/185; 331/96; 331/117 D; 330/286; 333/204
[58] Field of Search ................. 331/96, 117 D, 331/107 SL, 179, 185, 186; 330/53, 56, 199, 204, 286; 333/204

[56] References Cited

U.S. PATENT DOCUMENTS

| | | | |
|---|---|---|---|
| 2,262,020 | 11/1941 | Llewellyn | 178/44 |
| 2,453,716 | 11/1948 | Llewellyn | 178/44 |
| 2,716,222 | 8/1955 | Smullin | 333/83 |
| 3,840,828 | 10/1974 | Linn et al. | 333/735 |
| 4,019,161 | 4/1977 | Kimura et al. | 333/82 B |
| 4,189,690 | 2/1980 | Bock et al. | 332/30 V |
| 4,310,809 | 1/1982 | Buck et al. | 331/117 D |
| 4,318,064 | 3/1982 | Käch | 333/202 |
| 4,335,365 | 6/1982 | Pomé | 333/229 |
| 4,518,931 | 5/1985 | Rauscher | 331/76 |
| 4,565,979 | 1/1986 | Fiedziuszko | 331/117 D |
| 4,618,836 | 10/1986 | Gannon et al. | 331/96 |
| 4,630,004 | 12/1986 | Niehenke et al. | 331/107 SL |
| 4,736,454 | 4/1988 | Hirsch | 455/129 |
| 5,079,524 | 1/1992 | Sugawara | 331/96 |
| 5,109,205 | 4/1992 | Hart et al. | 333/104 |
| 5,159,287 | 10/1992 | Furutani et al. | 330/286 |
| 5,243,301 | 9/1993 | Tondryk | 330/296 |
| 5,483,206 | 1/1996 | Lohninger | 331/107 SL |
| 5,736,901 | 4/1998 | Nakamura et al. | 330/296 |

*Primary Examiner*—David Mis
*Attorney, Agent, or Firm*—Oppenheimer Wolff & Donnelly LLP

[57] ABSTRACT

A frequency-adjustable direct current biasing circuit is disclosed for providing a DC bias voltage or a DC connection to ground for an RF or microwave circuit without substantially affecting the RF or microwave signal of the circuit. The biasing circuit includes a transmission line having a first portion for connection to the RF circuit and a second portion connected to a low-impedance-to-ground structure, such as a bypass capacitor or a DC path to ground. The electrical length between the first and second portions is about 90 degrees. The biasing circuit further includes an open ended tuning stub coupled to the transmission line that has a length that is adjustable. By adjusting the length of the tuning stub, the biasing or grounding circuit can provide better isolation for RF energies at different selected frequencies. Also disclosed herein is a dielectric resonator oscillator (DRO) that uses the frequency-adjustable biasing circuit. Further disclosed is a DRO that includes a FET gate return having an RF-shunted, relatively high resistance coupled to the gate of a field effect transistor by way of a quarterwave transmission line. This improved FET gate return provides for reduced phase noise of the DRO.

26 Claims, 6 Drawing Sheets

RF/MICROWAVE OSCILLATOR HAVING FREQUENCY-ADJUSTABLE DC BIAS CIRCUIT

FIELD OF INVENTION

This invention relates generally to radio frequency or microwave circuits, and specifically to techniques for improving the direct current (DC) biasing of oscillators, amplifiers, and other RF/Microwave devices; for improving the gate return for a field effect transistor used in an oscillator; and for providing a cavity or enclosure for a dielectric resonator that provides improved temperature stability over a wide frequency range.

BACKGROUND OF THE INVENTION

Dielectric resonator oscillators (DROs) are very popular devices in the radio frequency (RF) or microwave electronic field. These oscillators are typically employed in communication systems, radar systems, navigation systems and other signal receiving and/or transmitting systems. Their popularity has been attributed to their high-Q, low loss, and conveniently sized devices for various applications in the RF and microwave fields. For the purpose of this application, the terms "radio frequency", "RF" and "microwave" are interchangeable, and are used to refer to the field of electronics that involve signal processing of electromagnetic energy cycling at a frequency range of about 800 MHz to about 300 GHz.

Although DROs provide substantial advantages over other types of oscillator designs, improving their performance and characteristics is an ongoing process. For instance, some ongoing developments include reducing the size of the DROs, increasing its efficiency, improving its manufacturing and reliability, reducing its phase noise, and improving its temperature stability. Of particular interest to this invention is the latter three objectives.

Manufacturers of DROs are concerned with improving the manufacturing and reliability of their products. The design of DROs presents a particular problem in that DROs typically perform well only for an RF energy or signal cycling at a discreet frequency or within a narrow frequency range. In other words, they generally meet their specified performance only for a very narrow frequency range. It follows then that if a DRO manufacturer wants to produce a line of DROs with different discreet output frequencies covering a wide frequency range, each DRO must be custom tailored for each of the frequencies. This custom tailoring of DROs leads to increased engineering time, manufacturing time, cost, inventory and logistics, and a reduction in the reliability of the DROs.

To illustrate the manufacturing and reliability problem of customizing DROs, consider the typical prior art series feedback or reflective type DRO 10 shown in FIG. 1. The DRO 10 consists of a dielectric resonator (DR) 12, field effect transistor (FET) 14, a DR-coupling or input resonator transmission line 16, output and source impedance matching circuits 18 and 20, direct current (DC) biasing circuits 22 and 24 for the drain and source of the FET, and a FET gate return resistor R3.

In the prior art, the DRO 10 is typically designed for efficiently and optimally producing an RF energy or signal cycling at one specific frequency, or within a very narrow frequency range. For example, the DRO 10 is specifically designed to produce an RF energy or signal cycling at a frequency $f_0$. In order for the DRO 10 to optimally perform, each of the elements of the DRO is tailored designed to optimally operate at such frequency $f_0$. For instance, the dielectric resonator 12 is chosen such that its lowest resonating frequency is slightly below the frequency $f_0$. Similarly, the output and source impedance matching circuits 18 and 20 are designed to provide the optimal impedance matching at frequency $f_0$. Also, the drain and source DC biasing circuits 22 and 24 are designed so that they optimally block an RF energy or signal cycling at the operating frequency of the DRO $f_0$.

To further illustrate the need for optimally designing each of the elements of the DRO 10 for its operating frequency $f_0$, consider for example the drain and source DC biasing circuits 22 and 24. The object of these circuits is to transmit DC power to the FET 14 without affecting the RF energy produced by the DRO 10. To accomplish this objective, the source and drain DC biasing circuits 22 and 24 include respective high impedance transmission lines 26 and 28, each having one end (RF end) connected to an RF-carrying portion of the DRO 10, and another end (DC end) being RF shunted to ground by a bypass capacitor, such as capacitors C1 and C2.

In order for the DC biasing circuits to optimally not affect the RF energy or signal produced by the DRO 10, the length of the high impedance transmission lines 26 and 28 are designed to have a length of a quarter wavelength of an RF energy cycling at the operating frequency of the DRO $f_0$. In addition, the bypass capacitors C1 and C2 are designed to produce an impedance to ground of less than one to two Ohms at the frequency $f_0$. The biasing circuits 22 and 24 typically include resistors R1 and R2 for setting the proper bias voltage for the FET 14. Any deviation of the length of the high impedance transmission lines 26 and 28 from a quarter wavelength length at the operating frequency $f_0$ of the DRO 10 will cause degradation in the performance of the DRO, such as a degradation in the phase noise performance of the device.

From the discussion above, it can be seen that in the prior art DRO 10, the elements of the DRO 10 are tailored designed for optimally operating at the specific operating frequency $f_0$ of the DRO. This presents a problem for manufactures of DROs that need to produce a line of DROs operating at a plurality of different discreet frequencies covering a wide frequency range. In other words, because each type of DROs must be custom designed, it leads to increased engineering time, manufacturing time, cost, inventory and logistics, and a reduction in the reliability of the DROs. Thus, there is a need for a universal DRO design that can be easily modified to optimally operate at a plurality of different discreet frequencies covering a wide frequency range.

Another concern in the design of DROs is the phase noise performance of the device. Reduction in phase noise is desired since high phase noise may affect the performance of systems employing DROs. For instance, DROs often produce an RF carrier that is to be modulated with a baseband signal. If the frequency response of the baseband signal include a relatively low frequency response, its frequency components lie near the RF carrier. If the RF carrier has poor phase noise characteristics, then it will interfere with the modulated baseband signal. Thus, it is desired to reduce phase noise as much as possible in DROs to avoid this interference problem.

Referring again to FIG. 1, one particular element of the prior art DRO 10, namely the FET gate return resistor R3, can cause significant degradation in the phase noise performance of the DRO. The gate return resistor R3 is typically connected in a series feedback or reflective type DRO at the end of the DR-coupling or input resonator transmission line 16. The purpose of the gate return resistor R3 is to provide a path to ground for positive charges that accumulate on the gate of the FET 14 during its operation.

More specifically, during the operation of the DRO 10, a large signal amplitude is generated at the gate input of the FET 14. As the large signal amplitude varies over the positive half of the sinusoid wave, a small amount of positive charges pass through the Schottky diode junction of the gate. These charges interfere with operation of the DRO, and therefore, need to be removed. Thus, the FET gate resistor R3 provides a path to ground to eliminate such unwanted charges. In order to eliminate any unwanted RF reflections off the FET gate resistor R3, this resistor is designed to match the characteristic impedance of the DR-coupling or resonator transmission line 16, which is typically 50 Ohms.

Although the problem of the unwanted positive charges at the input of the DRO 10 is substantially reduced by the FET gate resistor R3, this resistor has an adverse effect of degrading the phase noise performance of the DRO. The reasons for this is that the resistance value of the resistor R3 is relatively low, e.g. 50 Ohms, and it is not properly RF isolated from the DRO circuitry, i.e., it is directly connected to the end of the DR-coupling or resonator transmission line 16. As a result, the resistor affects the RF energy propagating via that DR-coupling or resonator transmission line 16, and consequently, adversely affects the phase noise of the DRO. Accordingly, there is a need to provide a FET gate return resistor that provides a path to ground for the unwanted positive charges emanating from the FET 14, without significantly degrading the phase noise performance of the DRO.

Yet another concern in the design of DROs is the temperature stability of the device. Although DROs have superior performance when it comes to phase noise and efficiency, DROs are susceptible to environment temperature changes if they are not properly designed. Therefore, a great deal of engineering time is spent in designing temperature-compensating elements and/or techniques for DROs.

For instance, in FIG. 2, a prior art temperature-compensating DRO circuit 30 is shown. The circuit 30 includes a DRO, such as like the prior art DRO 10 of FIG. 1, coupled to a phase lock loop (PLL) circuit 32. The PLL circuit 32 includes a crystal oscillator 34, a sampling phase detector 36 and a loop filter 38. As it is conventionally known, the crystal oscillator 34 produces a highly temperature-stable sinusoidal signal with typically a much lower frequency $f_x$ than the frequency $f_0$ of the DRO output. This sinusoidal signals coupled to a first input of the sampling phase detector 36, whereas the output sinusoidal signal of the DRO 10 is coupled to a second input of the sampling phase detector 36 by way of a directional coupler 40. The sampling phase detector 36 produces a phase error signal which is coupled to a frequency-responsive component (not shown), such as a varactor, of the DRO 10 by way of a loop filter 38.

Since the output of the crystal oscillator 34 is highly temperature stable, the output of the DRO 10 is also highly stable since the PLL circuit causes the stability DRO output frequency $f_0$ to track the stability of the frequency $f_x$ of the crystal oscillator 34. Hence, with the PLL circuit 32, the DRO 10 is temperature stable, or as good as the temperature stability of the crystal oscillator 34.

However, this temperature stability does not come without a price. For instance, the temperature compensated DRO circuit includes additional components, such as the crystal oscillator 34, sampling phase detector 36, loop filter 38, varactor (not shown) and directional coupler 40. These additional elements add to the costs of the DRO, increases the engineering and manufacturing time, increases inventory, complicates logistics, and reduces the reliability of the DRO circuit. Thus, there is a need for a temperature-compensated DRO that does not require such additional elements. In addition, there is a further need to provide such temperature compensation in a manner that applies to a plurality of operating frequencies so that the DROs need not be custom made.

OBJECTS OF THE INVENTION

The following includes some but not all, of the objects achieved by the disclosed invention:

It is a general object of the invention to provide a new and improved dielectric resonator oscillator (DRO);

It is an object of the invention to provide a DRO that can be easily modified to optimally operate at a plurality of different discreet frequencies covering a wide frequency range;

It is another general object of the invention to provide a new and improved amplifier;

It is another object of the invention to provide an RF amplifier that can be easily modified to optimally operate at different frequency ranges;

It is another general object of the invention to provide a new and improved DC biasing or grounding circuit for an RF circuit;

It is another object of the invention to provide a DC biasing or grounding circuit that is easily tunable for a plurality of different discreet frequencies;

It is another object of the invention to provide such easily tunable DC biasing or grounding circuit for a DRO;

It is another object of the invention to provide such easily tunable DC biasing or grounding circuit for an RF amplifier;

It is another general object of the invention to provide a cavity or housing for a dielectric resonator (DR);

It is another object of the invention to provide a cavity or housing that provides improved temperature stability for a DR device;

It is another object of the invention to provide a cavity or housing that has improved temperature stability for a DR device capable of operating at a plurality of different discreet frequencies covering a wide frequency range;

It is another object of the invention to provide a cavity or housing for a DRO; and It is another object of the invention to provide a cavity or housing for a dielectric resonator filter.

SUMMARY OF THE INVENTION

A first aspect of the invention includes a frequency-adjustable direct current (DC) biasing or grounding circuit for any radio frequency (RF) circuit that requires a biasing or grounding circuit, such as a dielectric resonator oscillator (DRO), an RF amplifier, a mixer, a pin attenuator, and a multiplier. The advantage of having a frequency-adjustable (DC) biasing or grounding circuit is that a single design can be used for numerous RF circuits that have different frequency responses. The frequency-adjustable biasing or grounding circuit merely requires minimal tuning so that it can best operate at a desired frequency or frequency range.

The DC biasing or grounding circuit of the invention preferably includes a transmission line for propagating therethrough a direct current or a low frequency signal, and for substantially blocking or isolating an RF energy or signal cycling at a selected frequency or frequency range. The transmission line includes a first portion thereof, preferably an end (referred to herein as an RF end), for connection to an RF circuit. The transmission line includes a second portion thereof, preferably an opposite end (referred to herein as a DC end), for connection to a bias voltage, direct path to ground or a direct path to ground by way of a resistor. The electrical length between the first and second portions of the transmission line is preferably about 90 degrees or about an odd multiple thereof (i.e. 270, 450, 630 . . . Etc. degrees) for an RF energy or signal cycling at a pre-determined frequency, preferably the upper frequency in a prescribed frequency range.

The DC biasing or grounding circuit of the invention includes a low impedance structure to RF ground coupled to the transmission line at about the second portion thereof, or alternatively, the DC end of the transmission line. Because the electrical length between the first and second portions of the transmission line is about 90 degrees or about an odd multiple, the low impedance structure at the second portion (e.g. DC end) translates into a high impedance, or preferably a substantially maximized normalized impedance, at the first portion (e.g. RF end) of the transmission line for an RF energy or signal cycling at the predetermined higher frequency.

In order to make the DC biasing or grounding circuit of the invention adjustable such that it can present a larger impedance, or preferably a substantially maximized normalized impedance, for RF energies or signals cycling at frequencies other than the pre-determined frequency, the circuit includes a tuning element coupled to the transmission line at about its first portion (e.g. RF end). Preferably, the tuning element is an open ended transmission line that has a length that can be adjusted. By adjusting the length of the open ended transmission line to a particular length, the DC biasing or grounding circuit can present a higher impedance, or preferably a substantially maximized normalized impedance, for an RF energy or signal cycling at a corresponding selected frequency.

Another aspect of the invention is an oscillator, preferably a DRO, that uses the frequency-adjustable DC biasing circuit described above to provide a bias voltage for its active device, such as a field effect transistor, bipolar junction transistor or the like. The frequency-adjustable DC biasing is particularly useful for a line of DROs producing different discrete output frequencies within a specified frequency range. The advantage of the frequency-adjustable DC biasing circuit is that a single design thereof can be incorporated into any of a number of DROs producing different discreet frequency signals.

In the preferred embodiment, the DRO includes an active device, such as a field effect transistor (FET); a dielectric resonator coupled to a port of the active device, such as the gate of the FET; and an adjustable-frequency biasing circuit for biasing the active device, such as the FET. The DRO may include impedance matching circuits as appropriate. With the frequency-adjustable DC biasing circuit, modifying the DRO for a different output frequency is simply done by adjusting the DC biasing circuit so that it provides substantially optimized RF blockage at the specified frequency, providing the proper dielectric resonator puck for the specified frequency, and performing minor tuning on the impedance matching circuits if appropriate to do so. With a versatile DC biasing circuit, a single design can be used on a plurality of different DROs. This leads to reduced costs, manufacturing and engineering efforts, inventory, logistics, and an improvement in the reliability of the DROs.

Another aspect of the invention is an improved technique for providing a gate return for a field effect transistor (FET) used in oscillators that leads to reduced phase noise. The FET gate return of the invention includes a relatively high resistor, for example of about at least 10 kilo Ohms. The resistor is connected to ground and coupled to the DRO by way of a high characteristic impedance transmission line, such that an end or portion thereof is coupled to the FET, preferably near the gate. The high impedance transmission line includes a length of about 90 electrical degrees (quarter wavelength) or about an odd multiple thereof at the operating frequency of the DRO. Preferably, the high characteristic impedance transmission line is connected to the input resonator transmission line if a series-feedback DRO is used. An RF bypass capacitor is preferably connected across the gate return resistor.

Because the FET gate resistor is of relatively high resistance, for example of about at least 10 kilo Ohms, coupled with the fact that it is further RF isolated from the DRO by the quarterwave transmission line, the DRO acquires improved phase noise performance. The FET gate return circuit of the invention can also be made frequency-adjustable, similar to the biasing or grounding circuit discussed above, such that a substantially maximized RF isolation is provided for other different output frequencies of the DRO. This leads to improved phase noise performance for the DRO at the selected frequency.

Yet another aspect of the invention is a cavity or enclosure for a dielectric resonator that provides improved temperature stability over a wide range of frequencies. This cavity would be particularly useful for a line of DROs that output different frequency signals, wherein a single cavity design could be used for all of the DROs and provide the needed temperature stability.

In particular, the dielectric resonator cavity of the invention includes a width or diameter Dc and a height Lc. It is designed to house a dielectric resonator structure, such as a dielectric resonator puck, having a width or diameter of Dr and a height Lr. According to the invention, in order to provide sufficient temperature stability, it is preferred that the diameter Dc of a cylindrical cavity be at least about 3 to about 7.5 times the width or diameter Dr of the enclosed dielectric resonator, and the height Lc of the cavity be at least about 3 to about 7.5 times the height Lr of the enclosed dielectric resonator. For a square cavity, it is preferred that the width Dc be at least about 3 to about $7.5/\sqrt{2}$ times the width or diameter Dr of the enclosed resonator, and the height Lc be at least about 3 to about $7.5/\sqrt{2}$ times the height Lr of the enclosed dielectric resonator. Since the resonant frequency of standard dielectric resonator puck linearly correlates with the diameter of the resonator, the cavity provides for improved temperature stability for a frequency range of more than an octave.

Because the dielectric resonator cavity of the invention can accommodate dielectric resonators having resonant frequencies that can differ by more than an octave, a single cavity design can be used on a line of DROs producing outputs that fall within the working frequency range of the cavity. This is of particular advantage since a single cavity design would facilitate manufacturing and engineering efforts, reduce costs, inventory and logistics, and improve the reliability of the DROs. Not only would it be useful for a line of DROs, but it would also be useful for a line of dielectric resonator filters having different frequency responses falling within the working range of the cavity. In addition, the cavity could also be used for other dielectric resonator applications.

BRIEF DESCRIPTION OF THE DRAWINGS

The above mentioned objects, other objects and features of the invention and the manner of attaining them will become apparent, and the invention itself will be best understood by reference to the following description of the preferred embodiments of the invention taken in conjunction with the accompanying drawings, wherein.

DETAILED DESCRIPTION OF THE PREFERRED EMBODIMENTS

Dielectric Resonator Oscillator Using Frequency-Adjustable Biasing Circuits

Figure 1:
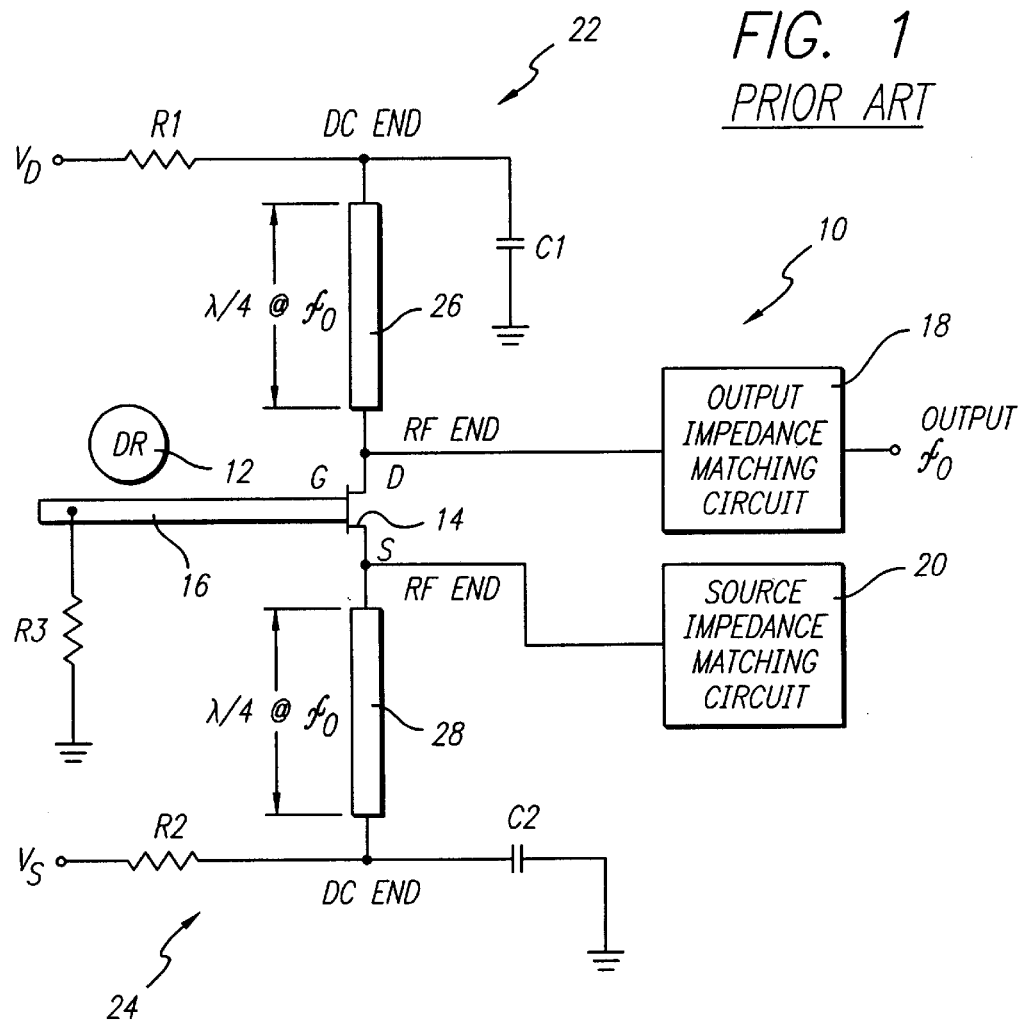
FIG. 1 is a schematic and block diagram of a prior art dielectric resonator oscillator (DRO)
Figure 2:
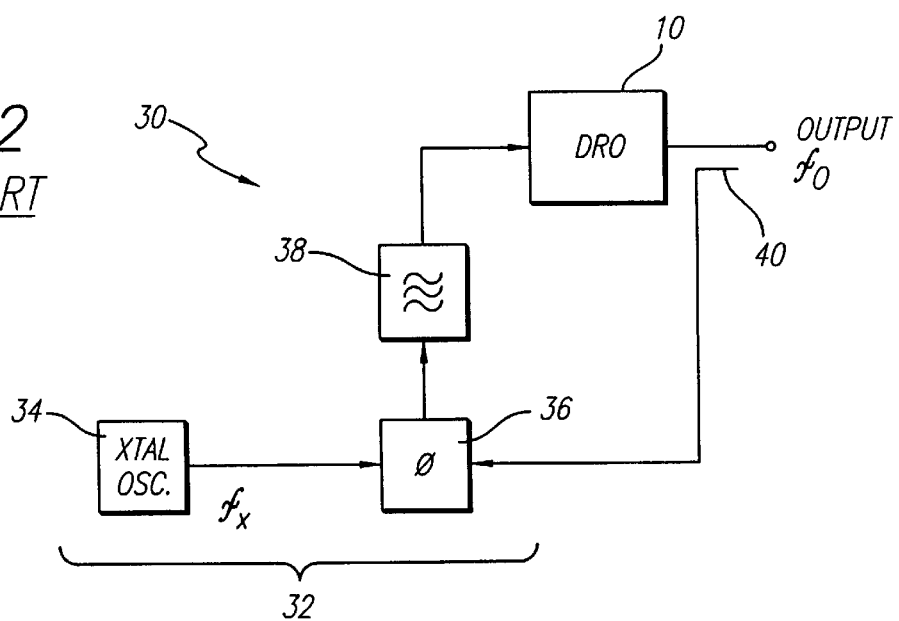
FIG. 2 is a block diagram of a prior art DRO with a temperature-compensating circuit.
Figure 3:
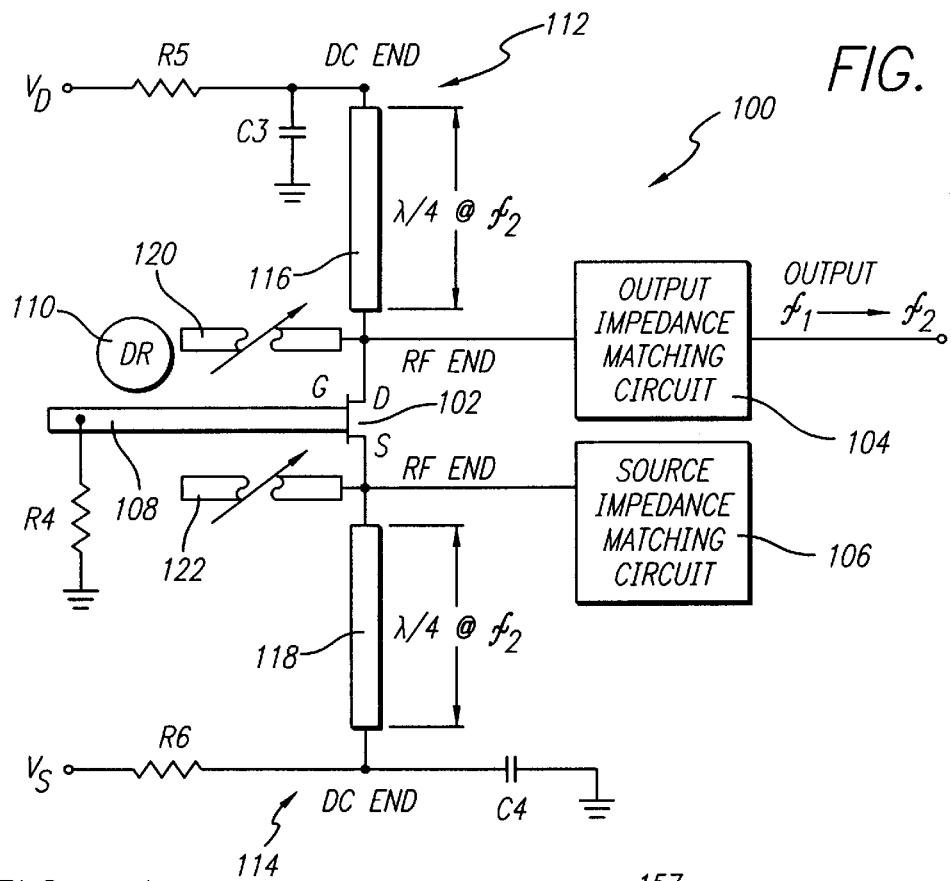
FIG. 3 is a schematic and block diagram of a DRO in accordance with an aspect of the invention.

Referring initially to FIG. 3, a schematic and block diagram of a dielectric resonator oscillator (DRO) 100 as an example of a preferred embodiment of the invention is shown. As shown, the DRO 100 used in this example of the invention is a series feedback or reflective type of DRO. Although this type of DRO is used to exemplify the invention, it shall be understood that other types of DROs may be configured to encompass the invention, including common source, common gate and common drain configurations if a field effect transistor is used as the DRO's active device; series and parallel dielectric coupling types of DROs; and a parallel feedback transistor DRO. Such types of DRO configurations are shown in the book authored by Darko Kajfex et al., entitled "Dielectric Resonators," Artech House 1986, chapter 10.

The DRO 100 preferably includes a metal-semiconductor field effect transistor (MESFET) or a pseudo-morphic high electron mobility transistor (PHEMPT) 102 as the DRO's active device. For the purpose of explaining the invention, the active device will be referred to simply as a field effect transistor or FET 102, and it shall be understood that it includes at least the above mentioned devices. In addition, it shall be understood that other active devices may be employed in place of the preferred MESFET OR PHEMPT, including for example bipolar transistors and heterojunction bipolar transistors.

The DRO 100 further includes output and source impedance matching circuits 104 and 106 coupled to the drain and source of the FET 102, respectively. The DRO 100 also includes an input resonator transmission line 108 including an end coupled to the gate of the FET 102. A dielectric resonator puck (DR) 110 is situated a distance from the gate of the FET 102 and spaced apart from the input resonator line 108, as it is conventionally done. In addition, a shunted FET gate return resistor R4 is preferably coupled to opened end of the input resonator transmission line 108.

As it was previously discussed, there is a need for a DRO design that can be easily modified to optimally perform at a plurality of different discreet frequencies within a specified frequency range. The invention achieves this objective by providing a DRO 100 that it includes adjustable-frequency direct current (DC) biasing circuits, such as drain and source DC biasing circuits 112 and 114. More specifically, the DC biasing circuits can be easily modified to optimally or substantially block an RF energy or signal cycling at a frequency that comes within a tunable range of the biasing circuits. By tuning the adjustable-frequency DC biasing circuits 112 and 114, the DRO 100 can be easily modified to optimally generate an RF energy or signal cycling at the specified frequency within a tunable range of the DC biasing circuits.

The DC biasing circuits 112 and 114 include respective transmission lines 116 and 118, each preferably having an electrical length of about 90 degrees or about an odd multiple thereof (such as 270, 450, 630 . . . etc. degrees) for an RF energy or signal cycling at a frequency preferably at the upper end of the frequency range for the DRO 100. In other words, if the DRO 100 can be easily modified to produce outputs having discreet frequencies within a frequency range from $f_1$ to $f_2$, then it is preferred that the transmission lines 116 and 118 have an electrical length of about 90 degrees or about an odd multiple thereof for an RF energy cycling at the upper end of the frequency range, i.e. $f_2$. In addition, the transmission lines 116 and 118 preferably include a high characteristic impedance of, for example, at least about 80 Ohms.

The transmission lines 116 and 118 of the DC biasing circuits 112 and 114 each include a first end (RF end) for attachment or electrical connection with an RF-carrying portion of the DRO 100, preferably near the drain and source of the FET 102, respectively. The DC biasing circuits 112 and 114 further include RF bypass capacitors C3 and C4 electrically connected to opposite ends (DC ends) of the transmission lines 116 and 118. In the preferred embodiment, the capacitance of capacitors C3 and C4 should preferably provide a low impedance to ground for an RF energy cycling at the lower end of the workable frequency range, i.e. frequency $f_1$. In the preferred embodiment, the capacitors C3 and C4 are chosen to provide a low impedance having an imaginary component of about one ohm or less at the lower end frequency $f_1$. The DC biasing circuits 112 and 114 may also include current-limiting resistors R5 and R6, which may be variable for properly setting the bias voltages for the FET 102.

The DC biasing circuits 112 and 114 become frequency-adjustable by the inclusion of a tuning element, such as tunable transmission lines or stubs 120 and 122. These transmission lines 120 and 122 are tunable because their electrical lengths or physical lengths can be adjusted. The tunable transmission lines 120 and 122 include respective first ends attached to about the RF ends of corresponding transmission lines 116 and 118 of the DC biasing circuits 112 and 114, respectively. The other ends of the tunable transmission lines 120 and 122 are preferably opened ends.

In operation, if the electrical length or physical length of the tunable transmission lines 120 and 122 is 0 degrees (as if there existed no tunable transmission lines), the normalized impedance at the RF ends of the transmission lines 116 and 118 are maximized or substantially maximized for an RF energy cycling at the upper end frequency $f_2$. This is because without the tunable transmission lines 120 and 122, the DC biasing circuits 112 and 114 look like the typical quarter wavelength biasing lines that are commonly employed in the prior art.

Since transmission lines 116 and 118 can be designed to have a plurality of characteristic impedances, the normalized impedance parameter is used because it is independent of the characteristic impedance of the transmission lines, and can be defined as the actual impedance Z divided by the characteristic impedance of the line $Z_0$, i.e. $Z/Z_0$. Alternatively, the maximum normalized impedance can also be defined as an impedance where the phase of an incident RF energy is substantially equal and opposite with the phase of a reflected RF energy at the region presenting maximum normalized impedance. Such regions in the DRO 100 of the invention are the RF ends of the transmission lines 116 and 118, or the regions where these lines attach to the RF-carrying portion of the DRO 100.

If the electrical lengths of the tunable transmission lines 120 and 122 are increased from 0 degrees to above 0 degrees, the maximum normalized impedance at the RF ends of the transmission lines 116 and 118 shift for RF energies or signals having frequencies lower than the upper end frequency $f_2$. Thus, by increasing or varying the electrical or physical lengths of the tunable transmission lines 120 and 122, the DC biasing circuits 112 and 114 can be tuned to increase the impedance, preferably to a substantially maximized normalized impedance, at the RF ends for an RF energy or signal having a discreet frequency within the working range of the DRO 100, i.e. frequency range $f_1$ to $f_2$.

It is desired for a DRO to have DC biasing circuits that minimizes the effects they have on the RF energy or signal being produced by the DRO. In order to do this, the DC biasing circuits preferably need to be designed to present to the RF circuit or DRO, a substantially maximized normalized impedance. In this manner, RF energy in the DRO cannot escape through or adversely reflect from the DC biasing circuits. For DROs, any adverse effects from the DC biasing circuits generally increases the phase noise of the RF energy or signal produced by the DRO. Therefore, for performance purposes, the DC biasing circuits 112 and 114 should be tuned so that a substantially maximized normalized impedance is present at the RF ends of the transmission lines 116 and 118 for the desired discreet output frequency. Thus, with the use of the adjustable-frequency DC biasing circuits 112 and 114, DRO 100 can be easily modified to optimally perform at a plurality of discreet frequencies.

An advantage of the frequency-adjustable DC biasing circuits 112 and 114 is that it allows a single DRO design to cover a plurality of discreet frequencies within the working frequency range. As a result, DRO manufacturers need not custom design the DROs for a particular output frequency. This provides for substantial savings in cost, engineering and manufacturing time, a reduction in inventory and logistics, and also improves the reliability of the DROs.

RF Amplifier and Other RF Devices Using Frequency-Adjustable Biasing Circuits

Figure 4:
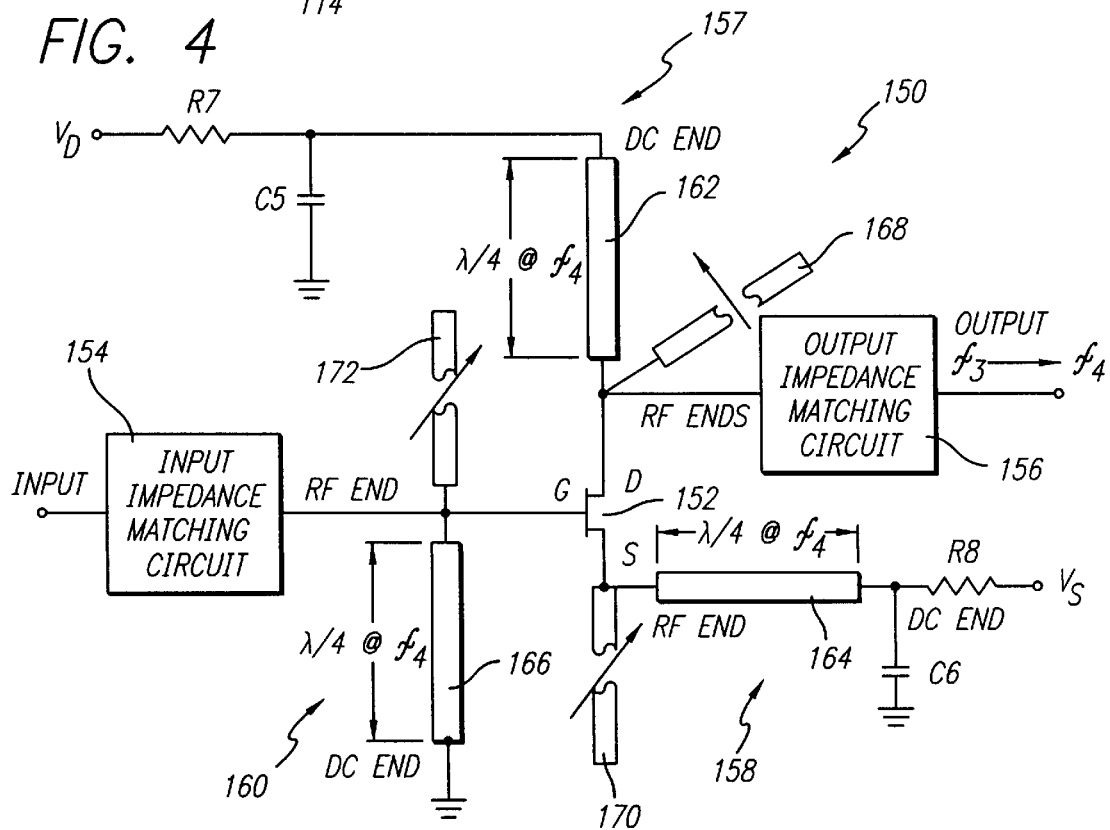
FIG. 4 is a schematic and block diagram of an RF amplifier in accordance with another aspect of the invention.

Although it has been shown that the frequency-adjustable DC biasing circuits 112 and 114 are substantially beneficial to DROs, it shall be understood that these biasing circuits can be employed in other RF circuits where DC biasing is required. For instance, in FIG. 4, an RF amplifier 150 is shown that includes a plurality of frequency-adjustable DC biasing circuits. As it is conventionally known, the RF amplifier 150 preferably includes a MESFET or PHEMPT 152, or can include in place thereof other suitable active devices such as a BJT or a hetero-junction BJT. The RF amplifier 150 also includes input and output impedance matching circuits 154 and 156, as it is conventionally employed.

The RF amplifier 150 also includes frequency-adjustable drain and source DC biasing circuits 157 and 158 and a frequency-adjustable gate DC grounding circuit 160. As previously discussed, the biasing and grounding circuits 157, 158 and 160 include respective transmission lines 162, 164 and 166, each having an electrical length of about 90 degrees or about an odd multiple thereof at preferably the upper end frequency $f_4$ of the operating frequency range $f_3$ to $f_4$ of the amplifier. The transmission lines 162, 164 and 166 include ends (RF ends) for electrically connecting to the source, drain and gate of the FET 152.

The adjustable-frequency biasing and grounding circuits 157, 158 and 160 also include tunable transmission lines or stubs 168, 170 and 172 coupled to about the RF ends of the transmission lines 162, 164 and 166. RF bypass capacitors C5 and C6 and current-limiting resistors R7 and R8 are coupled to about the DC ends of transmission lines 162 and 164. A direct path to ground is connected at the DC end of transmission line 166 of the grounding circuit 160. By adjusting the lengths of the tunable transmission lines 168, 170 and 172, the biasing circuits 157, 158 and 160 can be tuned for any specified frequency within the frequency range $f_3$–$f_4$, such as the center frequency.

Other RF devices or circuits that may benefit from such frequency-adjustable biasing or grounding circuits include, for example, mixers, pin attenuators, frequency multipliers or generally any other RF device that requires a biasing or grounding circuit where optimum RF isolation at a particular frequency is desired.

Preferred Layout of the Frequency-Adjustable Biasing and Grounding Circuits

Figure 5:
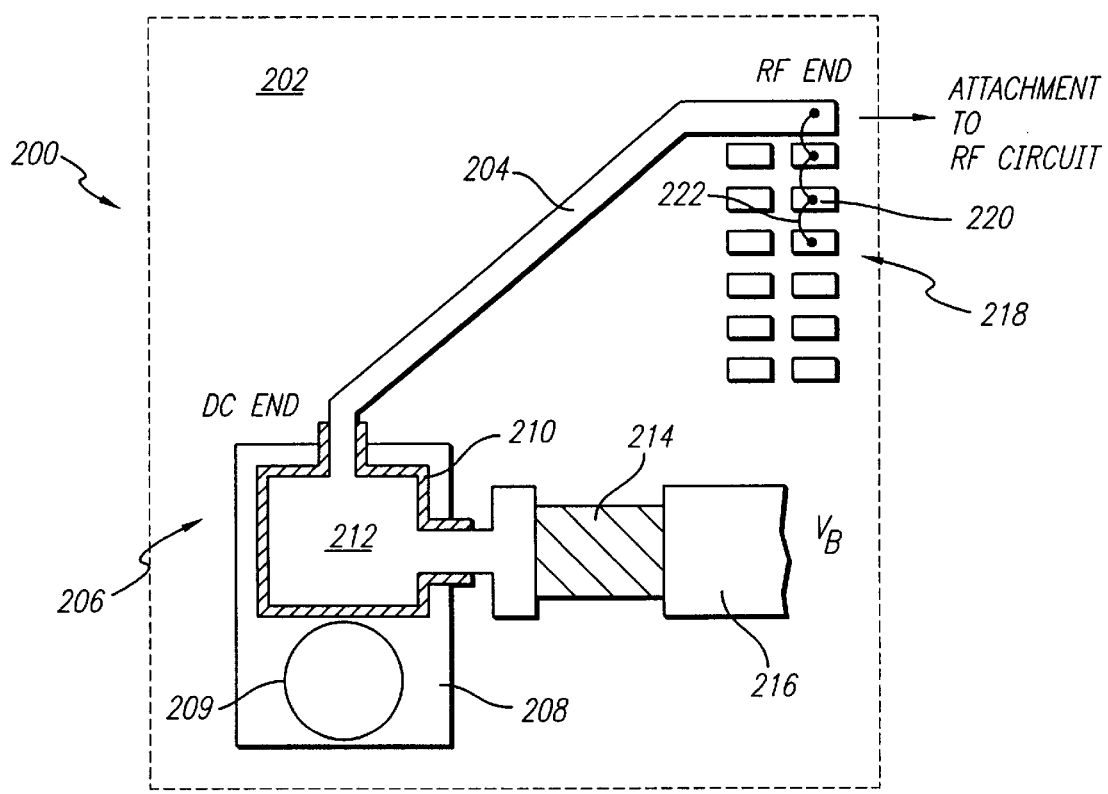
FIG. 5 is a layout of a direct current (DC) biasing circuit for an RF circuit in accordance with yet another aspect of the invention.

Referring to FIG. 5, a preferred configuration for a frequency-adjustable DC biasing circuit 200 is shown. The DC biasing circuit 200 is preferably formed on a substrate 202, preferably of alumina material having a preferred height between about 5 to 5 mils, and preferably in a microstrip configuration. The DC biasing circuit 200 includes an RF isolating transmission line 204 having an electrical length that extends from an RF end to a DC end of about 90 degrees or about an odd multiple thereof for an RF energy or signal cycling at a pre-determined higher frequency. In the preferred embodiment, the DC biasing transmission line 204 has a characteristic impedance of at least about 80 Ohms, and has a width of about 1 to 2 mils. Also in the preferred embodiment, the transmission line 204 is formed of two layers of thin films comprised of a lower layer of titanium-tungsten material and an upper layer of gold material. It shall be understood that the transmission line 204 can be formed of other suitable electrically-conductive materials or even of thick film materials.

The DC biasing circuit 200 also preferably includes a thin-film RF-bypass capacitor 206 comprised of a lower metal layer pad 208 including a metallized via hole 209 through the substrate 202 for electrically connecting to a grounded metal layer (not shown) formed on the underside of the substrate. The capacitor 206 also includes an insulating or dielectric layer 210 formed on the metallized pad 208 and may be comprised of silicon-nitride, silicon-dioxide material, or other suitable dielectric materials. The capacitor 206 further includes a top metallization layer 212 being electrically connected to the DC end of transmission line 204 and also to a biasing or current-limiting thin film resistor 214. Preferably, the resistor 214 is formed of tantalum-nitride or nickel chromium, but other suitable materials can be used in place thereof. The thin-film resistor 214 is also connected to a conductive line 216 for receiving a bias voltage $V_B$.

The DC biasing circuit 200 also includes at about the RF end of the transmission line 204, an adjustable-length, open ended transmission line 218 preferably comprised of a plurality of metallized pads 220 arranged along a line or in an array, and preferably electrically connected in series by a wire bond or ribbon 222 to form the required length of the open ended transmission line 218. The length of the open ended transmission line 218 can be adjusted by adding or deleting metallized pads to the series of pads electrically connected to each other by the wire or ribbon bond 222. As it is well known in the art, such wire or ribbon bond are typically welded on such metallized pads 220.

Figure 6:
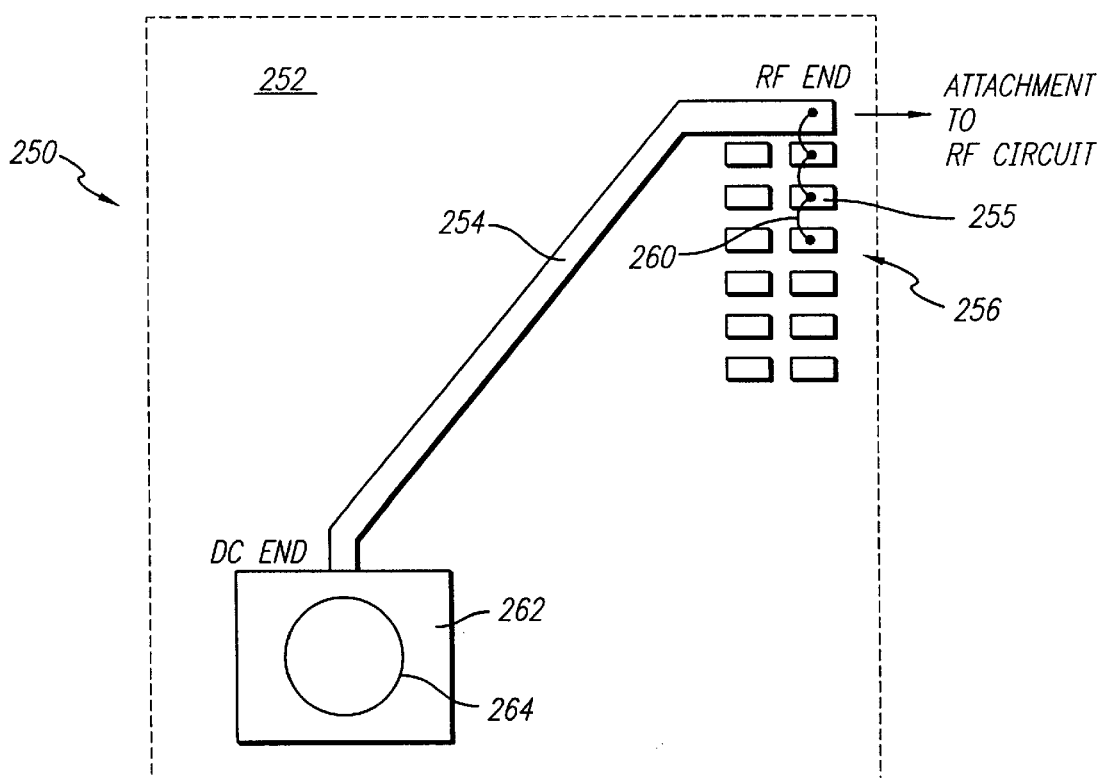
FIG. 6 is a layout of a DC grounding circuit for an RF circuit in accordance with another aspect of the invention.

Referring to FIG. 6, a preferred configuration for a frequency-adjustable grounding circuit 250 is shown. The grounding circuit 250 is similar to that of DC biasing circuit 200 described in FIG. 5, in that it includes a metallized transmission line 254 preferably formed on an alumina substrate 252 in a microstrip configuration, and having an electrical length of 90 degrees or an odd multiple thereof that extends from an RF end to a DC end. The grounding circuit 250 similarly includes an open ended transmission line 256 preferably comprised of a plurality of metallized pads 258, arranged in a line or in an array, and electrically connected in series by wire bond or ribbon 260. The length of the open ended transmission line 256 can be adjusted by adding or deleting metallized pads to the series of pads electrically connected by the wire or ribbon bond 258 for tuning the grounding circuit for better performance at other RF frequencies.

The grounding circuit 250 differs from the biasing circuit 200 in that a direct path to ground is connected to the DC end of the transmission line 254, rather than an RF bypass capacitor. Both structures, however, provide a low impedance to ground. In the preferred embodiment, the direct path to ground comprises a metallized pad 262 connected to about the DC end of the transmission line 254. The metallized pad 262 is grounded by way of a metallized via hole 264 electrically connected to a grounded metallized layer (not shown) on the underside of the substrate 252.

Improved FET Gate Return

Figure 7:
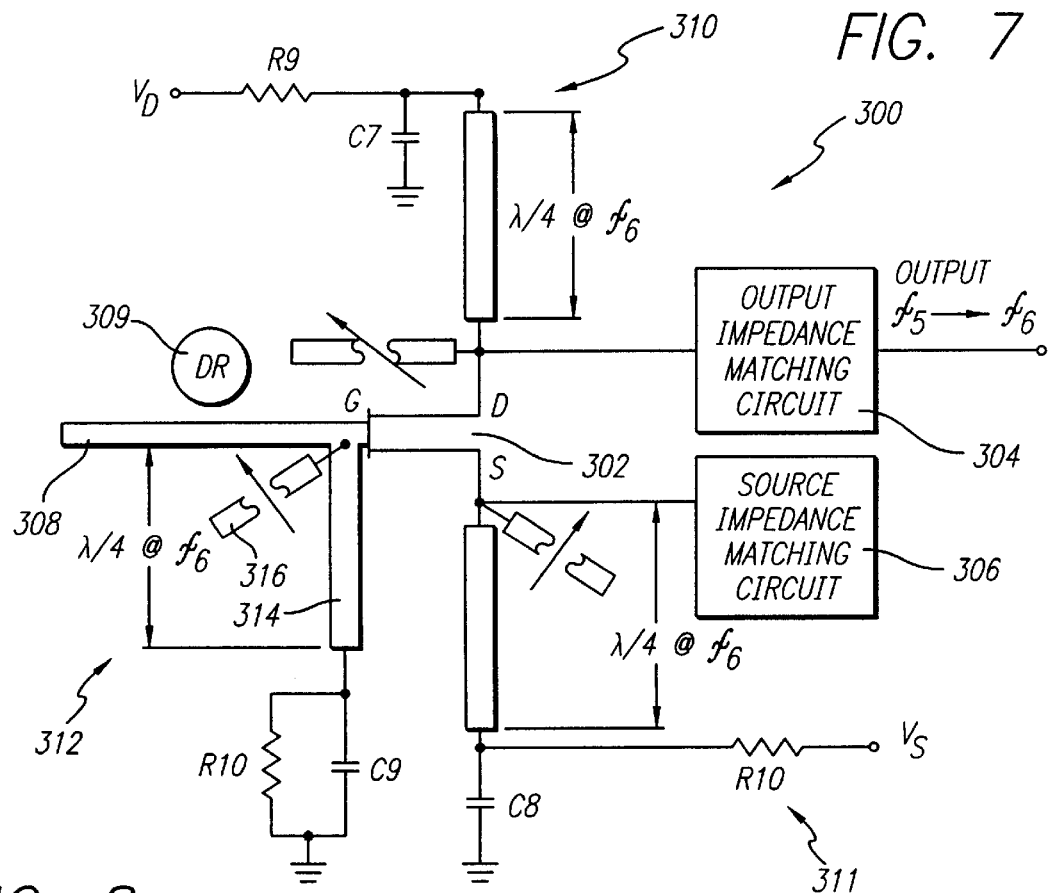
FIG. 7 is a schematic and block diagram of another DRO in accordance with another aspect of the invention.

Referring now to FIG. 7, a schematic and block diagram of an oscillator, preferably a DRO 300, as an example of another aspect of the invention is shown. This DRO 300 is directed at improving the FET gate return of the prior art to better reduce the phase noise of the DRO. The DRO 300 improves the phase noise performance of the device by eliminating the low resistance FET gate return typically employed in the prior art, and preferably including a much higher resistance FET gate return. The DRO 300 better RF isolates the FET gate resistor by employing a high-Q quarterwave transmission line circuit. The much higher resistance coupled with the RF isolating circuit reduces the effects the FET gate return has on the RF energy or signal of the DRO, thereby reducing the phase noise of the device.

The example DRO 300 of the invention preferably includes a MESFET or PHEMPT 302 as its active device, output and source impedance matching circuits 304 and 306 coupled to the drain and source of the FET 302 respectively, an input resonator transmission line 308 coupled to the gate of the FET 302, a dielectric resonator puck 309 spaced apart from and electromagnetically coupled to the input resonator transmission line 308, and source and drain bias circuits 310 and 311, which could be frequency-adjustable as previously described or fixed-frequency as in the prior art biasing circuits.

The improved phase noise performance of the DRO 300 of the invention comes about by an improved FET gate return circuit 312. The FET gate return circuit 312 comprises a transmission line 314 having an end (RF end) coupled to the input resonator transmission line 308 preferably near the gate of the FET 302. The transmission line 314 is preferably of high characteristic impedance, for example, of at least about 80 Ohms and includes an electrical length of about 90 degrees (quarter wavelength) or about an odd multiple thereof (such as 270, 450, 630 . . . etc. degrees) for the operating RF frequency of the DRO 300.

At the opposite end (DC end) of the transmission line 314 is connected an RF bypass capacitor C9 and a gate return resistor R10. The bypass capacitor C9 provides a low impedance to ground at about the DC end of the transmission line 314 for an RF energy cycling at the operating frequency of the DRO 300. In the preferred embodiment, the impedance of the bypass capacitor C9 at the operating frequency of the DRO 300 is preferably less than about one to two Ohms. The gate return resistor R10 preferably includes a resistance of at least about 10 kilo Ohms. Such high value resistance coupled with the RF isolating properties of the quarterwave transmission line 314, provides for minimal effects the gate return resistance has on the RF energy or signal of the DRO 300. This leads to improved phase noise characteristics of the DRO 300.

The improved FET gate return 312 can also be made to be frequency-adjustable, similar to the adjustable biasing or grounding circuits previously discussed. In this regard, the transmission line 314 preferably includes an electrical length of about 90 degrees (quarter wavelength) or about an odd multiple thereof at the highest operating RF frequency of the DRO 300, i.e. $f_6$. In addition, the bypass capacitor C9 preferably includes an impedance of less than about one to two Ohms for an RF energy cycling at the lower end of the frequency range, i.e. $f_5$. In order to optimize the RF isolating properties of the transmission line 314 for other discreet frequencies, an adjustable-length, preferably open-ended, transmission line 316 is coupled to the transmission line 314 at about its RF end. As previously discussed, by adjusting the length of the transmission line 316, the RF isolation at the RF end of the FET gate return 312 can be optimized for other discreet frequencies within the working frequency range $f_5$ to $f_6$.

Figure 8:
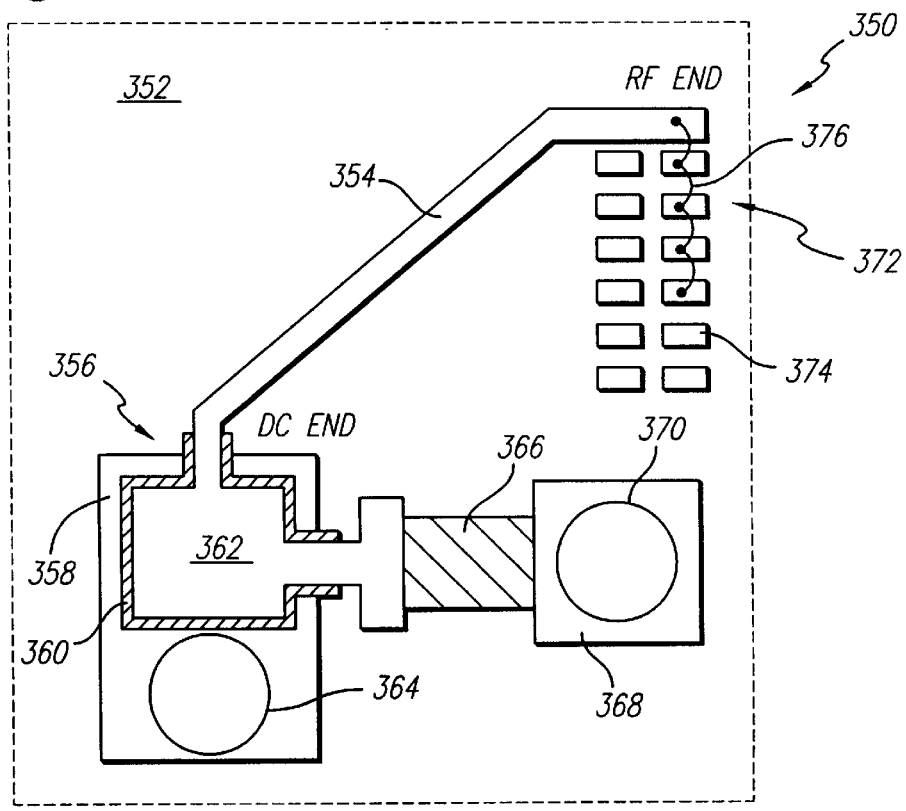
FIG. 8 is a layout of a field effect transistor (FET) gate return circuit in accordance with another aspect of the invention.

Referring to FIG. 8, a preferred configuration for a frequency-adjustable FET gate return circuit 350 is shown. The FET gate return 350 is formed on a substrate 352, preferably of an alumina material having a height of about 5 to 25 mils, and in a microstrip configuration. The FET gate return 350 includes a transmission line 354 having an electrical length from an RF end to a DC end of the line of about 90 degrees or about an odd multiple thereof, preferably at the upper frequency of the working frequency range of the DRO.

The transmission line 354 preferably includes a high characteritstic impedance of at least about 80 Ohms, and therefore has a width of about 1 to 2 mils. The transmission line 354 is preferably formed of suitable conducting thin-film material, such as titanium-tungsten-gold or chromium-copper-gold.

The FET gate return 350 further includes an RF bypass capacitor 356 coupled to the DC end of the transmission line 354. The capacitor 356 comprises a lower metallization layer pad 358 formed on the substrate 352, an insulating layer 360, preferably of silicon nitride or silicon dioxide material, formed on the lower metallization layer pad, and an upper metallization layer 362 formed on the insulating layer. The lower metallization layer pad 358 is connected to ground preferably by way of a metallized via hole 364 formed through the substrate 352 and electrically connected to a metallization layer (not shown) formed on the underside of the substrate. The upper metallization layer 362 of the capacitor 356 is connected to the DC end of the transmission line 354.

The FET gate return 350 further includes a gate return resistor 366 electrically coupled to the capacitor 356 by way of the upper metallization layer 362. The resistor 366 preferably includes a resistance of about at least 10 kilo Ohms and is preferably formed of suitable thin-film material, such as tantalum-nitride or nickel chromium. The resistor 366 is electrically connected to ground by way of metallization pad 368 including a metallized via hole 370 through the substrate 352. The metallized via hole 370 is electrically connected to a grounded metallization layer (not shown) formed on the underside of the substrate 352.

In order for the FET gate return 350 to provide optimized RF isolation for RF frequencies within the working frequency range, an adjustable-length, preferably open-ended transmission line 372 is coupled to the transmission line 354 at about its RF end. The adjustable-length transmission line 372 is preferably formed of a plurality of metallized pads 374 formed in a line or in an array configuration, which are electrically connected to each other by wire bond or ribbon 376. The length of the transmission line 372 can be adjusted by adding or removing metallized pads 374 from the connection formed by the wire bond or ribbon 376.

Multiple-Frequency Dielectric Resonator Cavity

As previously discussed, it is desired that a DRO be designed such that it can be easily modified to optimally perform at a plurality of discreet frequencies covering a wide frequency range, preferably by replacing the appropriate dielectric resonator puck and performing minimal or minor tuning on the DRO circuit. If this can be done, a DRO design need not be customized for different output frequencies. This would reduce engineering and manufacturing time, inventory, the complexity in logistics, and increases the reliability of the DRO circuit.

Not only is it desirable that the DRO be designed so that it is capable of operating over a wide frequency range with minimal modification, it is also desirable that the DRO be temperature stable over such wide frequency range. A dielectric resonator is affected by changes in the environment temperature in at least a couple of manners. First, changes in temperature causes the dielectric resonator to either expand or contract. Such expansion and contraction of a dielectric resonator decreases and increases its resonant frequency, respectively. Second, the resonant frequency of a dielectric resonator also changes as a metal object is brought near the dielectric resonator. Specifically, as a metal object is brought near the dielectric resonator, the resonant frequency of the dielectric resonator typically increases. If it is gradually removed from near the dielectric resonator, the resonant frequency typically decreases until it is no longer affected by the metal object.

A metal cavity or enclosure that houses a dielectric resonator acts similar to a metal object in proximity of a dielectric resonator, i.e. it affects the resonant frequency of the dielectric resonator depending on the distance between the cavity and the dielectric resonator. As environment temperature changes occur, the dielectric resonator cavity or enclosure either expands or contracts. This expansion or contraction of the cavity affects the resonant frequency of the dielectric resonator. Consequently, the resonant frequency of the DRO output is similarly affected.

In order to improve the temperature stability of a DRO design and also provide a design that is capable of operating over a wide frequency range with minimal modifications required, the inventor has conceived an optimum sizing for a dielectric resonator cavity or enclosure. This discovered sizing for the dielectric cavity would not only provide better temperature stability for the DRO, but would achieve such improved temperature stability for a plurality of dielectric resonators having resonant frequencies covering a wide frequency range.

Figure 9A:
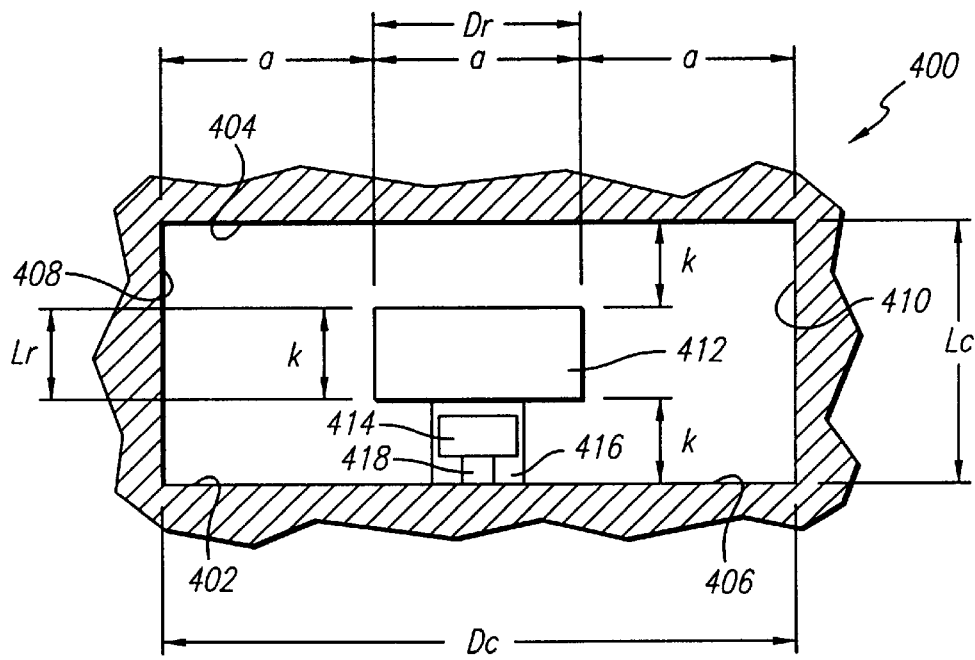
FIGS. 9A and 9B are side and bottom cross-sectional views of a cavity design for a dielectric resonator in accordance with another aspect of the invention.
Figure 9B:
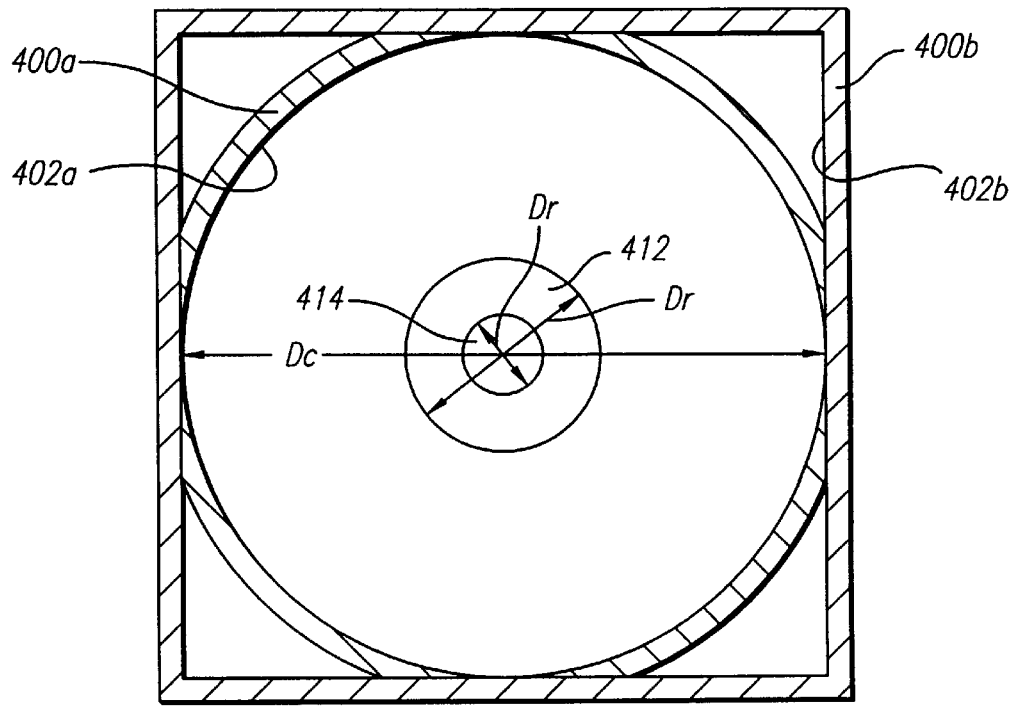

Referring to FIGS. 9A and 9B, side and top cross-sectional views of a dielectric resonator cavity or enclosure 400 are shown. In the example cavity of the invention, a cylindrical shaped cavity 400a and a square shaped cavity 400b (preferably square) are used to illustrate the optimum sizing of the cavity. Reference number 400 is used to refer to the cavity generally, without regard to its specific shape. The letters "a" and "b" in connection with a reference number are used to refer to the cylindrical and square cavities, respectively. Although the cylindrical and square cavities are used to exemplify the invention, it shall be understood that the optimum sizing of the cavity can be applied to other shapes, as explained later.

In detail, the cavity 400 includes an inner surface 402 that is preferably in a cylindrical 402a or square 402b configuration including a top or ceiling 404, a bottom or floor 406, and a side wall (cylindrical) or walls (square) 408 and 410. The diameter or width of the inner surface 402 of the cavity 400, i.e. the width or diameter of the top 404 and bottom 406, can be represented as Dc. Whereas the height of the inner surface 402 of the cavity 400, i.e. the height of the side wall(s) 408 and 410, can be represented as Lc.

The dielectric resonator cavity 400 houses or encloses a dielectric resonator structure, preferably of a puck or cylindrical shape. A pair of dielectric resonator pucks 412 and 414 along with corresponding stand-offs 416 and 418 are shown in FIGS. 9A and 9B (FIG. 9B does not show the stand-offs for the sake of clarity). The dielectric resonator pucks 412 and 414 represent the preferred extremes of the range of dielectric resonator size that can be enclosed by the cavity 400 and achieve optimum temperature stability. The width or diameter of a dielectric resonator puck that can be housed by the cavity 400 in accordance with the invention can be represented as Dr. Whereas the height of such dielectric resonator puck can be represented as Lr.

The inventor has discovered that in order for the cylindrical cavity 400a to provide improved temperature stability for an enclosed dielectric resonator, it is preferred that the diameter Dc of the inner surface 402a of the cavity 400a, i.e. the width or diameter of the top 404 and bottom 406, be within a range of about 3 times to about 7.5 times the diameter or width Dr of the enclosed dielectric resonator. In addition, it is preferred that the height Lc of the inner surface 402a of the cavity 400a, i.e. the height of the side wall 408, be within a range of about 3 times to about 7.5 times the height Lr of the enclosed dielectric resonator.

For the square cavity 400b to provide improved temperature stability for an enclosed dielectric resonator, it is preferred that the width Dc of the inner surface 402b of the cavity 400b, i.e. the width of the top 404 and bottom 406, be within a range of about 3 times to about $7.5/\sqrt{2}$ times the diameter or width Dr of the enclosed dielectric resonator. In addition, it is preferred that the height Lc of the inner surface 402b of the cavity 400b, i.e. the height of the side walls 408 and 410, be within a range of about 3 times to about $7.5/\sqrt{2}$ times the height Lr of the enclosed dielectric resonator.

In other words, the following preferred relationships hold:

| Cylindrical Cavity | Square Cavity | |
|---|---|---|
| 7.5 * Dr ≥ Dc ≥ 3 * Dr | $7.5/\sqrt{2}$ * Dr ≥ Dc ≥ 3 * Dr | Eq. 1 |
| 7.5 * Lr ≥ Lc ≥ 3 * Lr | $7.5/\sqrt{2}$ * Lr ≥ Lc ≥ 3 * Lr | Eq. 2 |

In the example shown in FIGS. 9A and 9B, dielectric resonator puck 412 represents the largest dielectric resonator puck that can be preferably enclosed by cavity 400 and exhibit improved temperature stability. That is, the diameter Dc and height Lc of the inner surface 402 of the cavity 400 is about 3 (cylindrical and square) times larger than diameter Dr and height Lr of the dielectric resonator puck 412. With respect to the largest dielectric resonator puck 412, it is preferred that the height of the stand-off 416 is such that the puck 412 is situated near the center of the cavity 400. This would result in the distances between top 404 and the puck, and the bottom 406 and the puck to be approximately equal distances, i.e. k.

The dielectric resonator puck 414 represents the smallest dielectric resonator puck that can be preferably enclosed by cavity 400 and exhibit improved temperature stability. That is, the diameter Dc and height Lc of the inner surface 402 of the cavity 400 is about 7.5 (cylindrical) or $7.5/\sqrt{2}$ (square) times larger than the diameter Dr and height Lr of the dielectric resonator puck 414.

Thus, the preferred frequency range for cavity 400 is determined by about the resonant frequency of the preferred largest dielectric resonator puck 412 and the preferred smallest dielectric resonator puck 414. The resonant frequency for a cylindrical dielectric resonator (puck) may be approximated by the following equation:

$$f_{RES}=K_{CORR}/[K_P^{1/2}*(\pi_4)^{1/3}*(Dr^2*Lr)^{1/3}] \quad \text{Eq. 3}$$

where $f_{RES}$ is the resonant frequency of the puck, $K_{CORR}$ is a constant correction factor, and $K_p$ is the dielectric constant of the puck material. Most cylindrical dielectric resonators are designed such that their height Lr fall within the following range relative to their diameters Dr:

$$0.35*Dr<Lr<0.45*Dr \quad \text{Eq. 4}$$

Assuming that the height of a dielectric resonator puck is about 0.40 times its diameter Dr, equation 3 reduces to the following relationship:

$$f_{RES}=K_{CORR}/[K_P^{1/2}*(\pi/4)^{1/3}*(0.4)^{1/2}*Dr] \quad \text{Eq. 5}$$

Equation 5 illustrates that there exists a linear, but inverse, relationship between the diameter Dr of the dielectric resonator puck and its resonant frequency $f_{RES}$. Assuming that the largest and smallest dielectric resonator pucks 412 and 414 have the same dielectric constant, then the working frequency range $f_7$ to $f_8$ of the cavity 400 can be approximated by the following relationship:

$$f_8/f_7=f_{RES}(\text{small puck})/f_{RES}(\text{large puck})= \quad \text{Eq. 6}$$

Dr(large puck)/Dr(small puck)

Substituting the preferred ranges for the diameter Dr of enclosed dielectric resonator pucks given by equation 1, the following relationship approximates the working frequency range for the cavity 400:

| Cylindrical Cavity | Square Cavity | |
|---|---|---|
| $f_8/f_7 = 7.5/3 = 2.5$ | $f_8/f_7 = 7.5/3\sqrt{2} = 1.77$ | Eq. 7 |

Hence, according to equation 7, it can be seen that the working frequency range for the cylindrical cavity 400a is well over an octave, and for the square cavity is about three-quarters of an octave. As a result, a plurality of DROs having different respective discreet output frequencies covering a wide frequency range can be designed with the use of a single cavity 400. This is of considerable advantage with respect to engineering and manufacturing time, cost, inventory, logistics and reliability.

Although the preferred dimensions for the cavity 400 is provided by equations 1 and 2, it shall be understood that other preferred ranges may include any subset within the preferred range. For instance, the following Tables 1 and 2 provide examples of other preferred ranges within those given by equations 1 and 2 for the cylindrical and square cavities, respectively:

TABLE 1

Cylindrical Cavity

| Dc (Approximate Lower Value) | Dc (Approximate Upper Value) | Lc (Approximate Lower Value) | Lc (Approximate Upper Value) |
|---|---|---|---|
| 4.5 * Dr | 7.5 * Dr | 4.5 * Lr | 7.5 * Lr |
| 5.0 * Dr | 7.5 * Dr | 5.0 * Lr | 7.5 * Lr |
| 5.5 * Dr | 7.5 * Dr | 5.5 * Lr | 7.5 * Lr |
| 6.0 * Dr | 7.5 * Dr | 6.0 * Lr | 7.5 * Lr |
| 5.0 * Dr | 7.0 * Dr | 5.0 * Lr | 7.0 * Lr |
| 5.0 * Dr | 6.5 * Dr | 5.0 * Lr | 6.5 * Lr |

TABLE 2

Square Cavity

| Dc (Approximate Lower Value) | Dc (Approximate Upper Value) | Lc (Approximate Lower Value) | Lc (Approximate Upper Value) |
|---|---|---|---|
| 3.50 * Dr | 5.30 * Dr | 3.50 * Lr | 5.30 * Lr |
| 4.00 * Dr | 5.30 * Dr | 4.00 * Lr | 5.30 * Lr |
| 4.50 * Dr | 5.30 * Dr | 4.50 * Lr | 5.30 * Lr |
| 5.00 * Dr | 5.30 * Dr | 5.00 * Lr | 5.30 * Lr |
| 4.00 * Dr | 4.80 * Dr | 4.00 * Lr | 4.80 * Lr |
| 4.00 * Dr | 4.30 * Dr | 4.00 * Lr | 4.30 * Lr |

As previously mentioned, the optimum sizing for the dielectric resonator cavity can be applied to other shapes. As a general rule, the distance from the center of the shape (where the dielectric resonator lies) to the most outer edges of its inner surface should not exceed the corresponding distance of the upper boundary for the cylindrical cavity, i.e. 7.5/2*Dr. Also, that same distance should not be less than the corresponding distance of the lower boundary for the cylindrical cases, i.e. 3/2*Dr.

Figure 10:
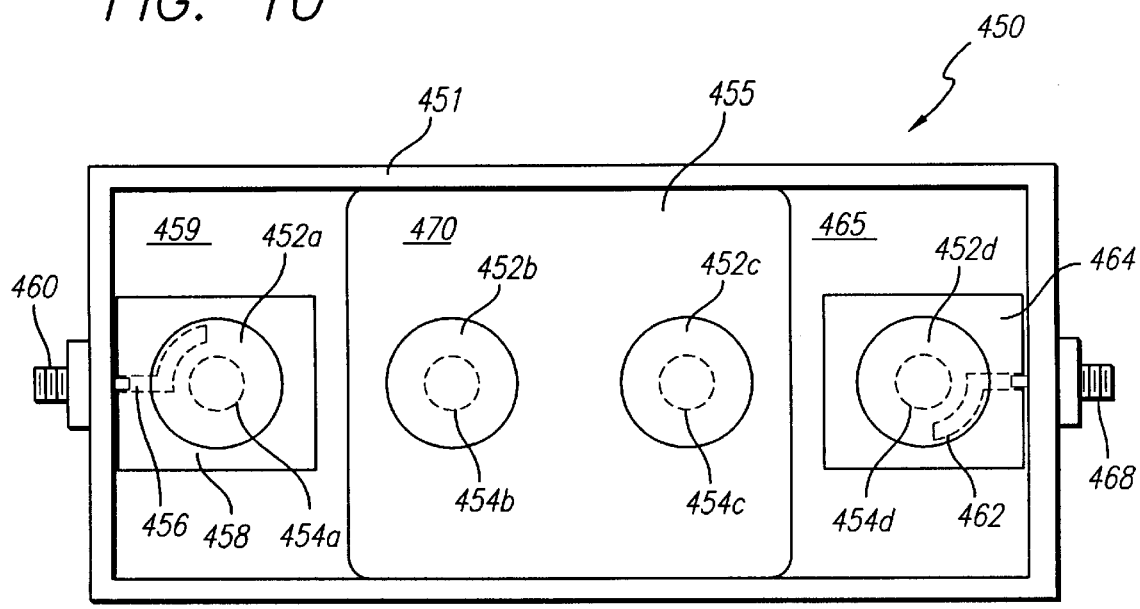
FIG. 10 is a top view of a dielectric resonator band pass filter in accordance with another aspect of the invention.

Although the dielectric resonator cavity 400 has been described for DRO applications, it shall be understood that it can also be used for other dielectric resonator applications, such as filters. Referring to FIG. 10, a top view of an example of a dielectric resonator band pass filter 450 in accordance with the invention is shown. For illustrative purposes only, the filter 450 is made to be a band pass filter having four poles. It shall be understood, however, that the number of poles, the filter type (e.g. band pass), or configuration of the filter is not critical to the invention. Thus, it can encompass band reject filters or other types of dielectric resonator filters.

The filter 450 includes a metallized or electrically conducting housing 451. Being a four-pole filter, the filter 450 includes four dielectric resonators 452*a–d* along with corresponding stand-offs 454*a*–454*d* (shown as dashed lines because they underlie the resonators) situated within a cavity 455 of the housing 451. The filter 450 is preferably configured such that adjacent dielectric resonators are electromagnetically coupled to each other.

The dielectric resonator filter 450 may also include an input transmission line 456 preferably formed on a substrate 458 in a microstrip configuration. The substrate 458 may be situated on a raised portion 459 on the housing 451, and alternatively include a carrier (not shown). The input transmission line 456 may also be coupled to a coaxial connector 460 that is connected on the housing 451, as it is conventionally done. Preferably, the dielectric resonator 452*a* along with its stand-off 454*a* can be situated on top of the substrate 458 such that a portion of the transmission line 456 underlie the dielectric resonator. Also in the preferred embodiment, a region of the transmission line 456 that is about electrically 90 degrees or an odd multiple thereof from the end of the line is situated below the dielectric resonator 452*a*, since that is the region that achieves the optimum coupling between the line and the resonator.

The dielectric resonator filter 450 may also include an output transmission line 462 preferably formed on a substrate 460 in a microstrip configuration and situated on raised portion 465 of the housing 451. These elements can be configured similar to the input of the filter including a coaxial connector 468 coupled to the transmission line 462. In actuality, the input and output may be a misnomer since the filter is a passive device, and the input can serve as the output and vice-versa.

The middle dielectric resonators 452*b–c* including their respective stand-offs 454*b–c* may be situated in a recess portion 470 of the housing 451 so that preferably all of the dielectric resonators are situated at the same height. This provides for optimum coupling between adjacent resonators. The dielectric resonators 451*a–d* may be connected to the corresponding standoffs 454*a–d* and together to the housing 451 and/or substrates 458 and 464 by suitable adhesives or mechanical devices.

In order to provide improved temperature stability for the dielectric resonator filter over a wide range of frequencies, the cavity 455 of the housing 451 is preferably dimensioned with respect to the dielectric resonators 451*a–d* in accordance with ranges specified by equations 1 and 2, or with the subset ranges provided by Tables 1 and 2. This would allow one housing design to be used on a multitude of filters having different frequency responses within the working frequency range of the cavity.

Figure 11:
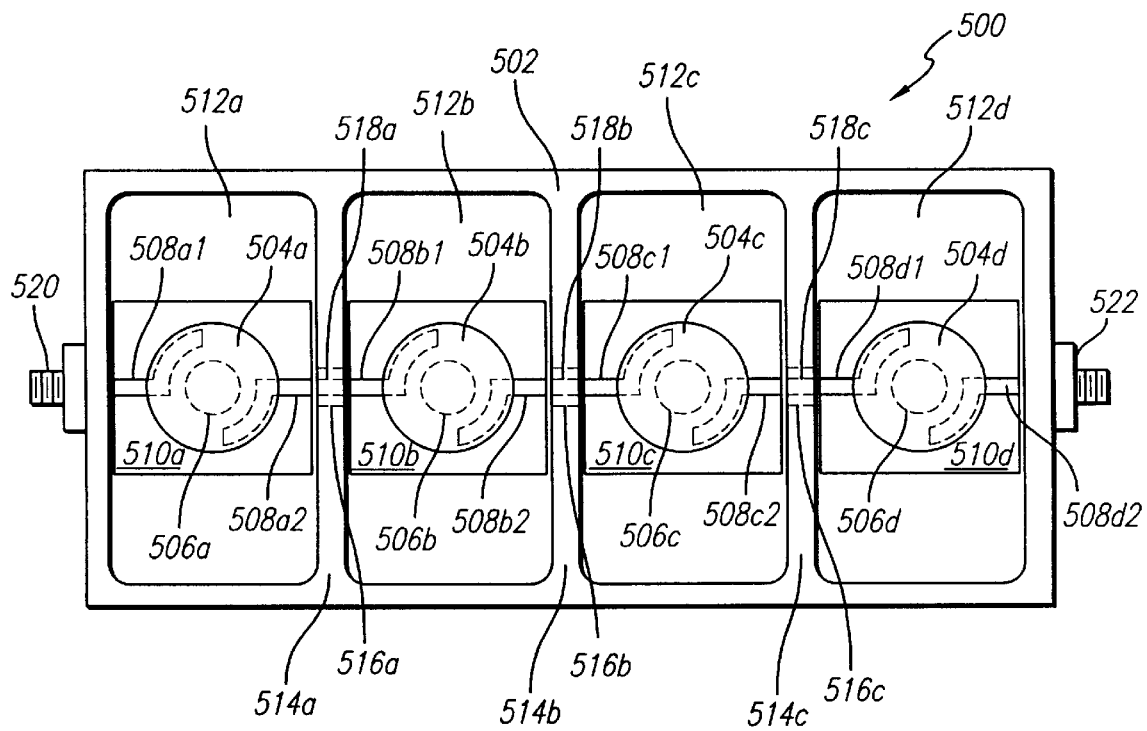
FIG. 11 is a top view of another dielectric resonator band pass filter in accordance with another aspect of the invention.

Referring to FIG. 11, a top view of another example of a dielectric resonator filter 500 in accordance with the invention is shown. The filter 500 is similar to filter 450, except each of the dielectric resonators are preferably enclosed within respective cavities and coupling between resonators is preferably by way of microstrip transmission lines, feedthroughs or the like.

More specifically, the filter 500 is also a four-pole filter in that it includes four dielectric resonators 504*a–d,* preferably of cylindrical shape, and preferably mounted on respective standoffs 506*a–d* (shown as dotted lines since they preferably underlie the respective pucks). The dielectric resonators 504*a–d* along with respective standoffs 506*a–d* are preferably mounted together and to the substrates 510*a–d* with suitable adhesives or mechanical devices. The substrates 510*a–d* preferably include respective input and output transmission lines 508*a–d,* preferably formed on the substrates as metallized thin-films in a microstrip configuration. As mentioned above, the fact that the transmission lines 508 are designated as input and output is a misnomer since this filter is a passive device, and therefore the inputs can serve as outputs, and vice-versa.

The housing 502 of the dielectric resonator filter 500 preferably includes four cavities 512*a–d* for enclosing each of the respective dielectric resonators 504*a–d*. The cavities 512*a–d* are preferably separated by traversing metallized walls 514*a*–514*c* which are preferably formed integral as part of the housing 502. The dimensions of the cavities 512*a–d* with respect to the corresponding dielectric resonators 512*a–d* are preferably designed in accordance with the ranges prescribed by equations 1 and 2, or any other the sub-ranges or subsets within the ranges prescribed by equations 1 and 2, such as those listed in Tables 1 and 2. As previously discussed, such cavity design provides for improved temperature stability over a wide frequency band, which allows a single cavity design to be used on a plurality of filters having frequency responses within the band.

The traversing walls 514*a–c* include respective openings 516*a–c* that each preferably include a feedthrough, transmission line or any coupling device for coupling between adjacent dielectric resonators 504. The filter 500 may also include suitable input and output connectors, such as coaxial connectors 520 and 522.

While the invention has been described in connection with various embodiments, it will be understood that the invention is capable of further modifications. This application is intended to cover any variations, uses or adaptation of the invention following, in general, the principles of the invention, and including such departures from the present disclosure as come within known and customary practice within the art to which the invention pertains.

It is claimed:

1. A direct current (DC) biasing or grounding circuit for coupling to a radio frequency (RF) circuit, wherein said DC biasing or grounding circuit is capable of substantially blocking the transmission therethrough of a first radio frequency energy cycling at a selected frequency, comprising:

a first transmission line having a first portion thereof for connection to said RF circuit and a second portion thereof, wherein a first length between said first and second portions is about 90 electrical degrees or about an odd multiple thereof for a second radio frequency energy cycling at a pre-determined frequency;

a low impedance-to-ground structure coupled to said first transmission line line by way of said second portion thereof; and a second transmission line coupled to said first transmission by way of said first portion thereof, said second transmission line having a second length sufficient to increase the normalized impedance at said first portion of said first transmission line for said first radio frequency.

2. The circuit of claim 1, wherein said pre-determined frequency is greater than said selected frequency, and said second transmission line includes an opened end.

3. The circuit of claim 2, wherein said second length of said second transmission line is adjustable for increasing said normalized impedance at said first portion of said first transmission line to other radio frequency energies having frequencies lower than said pre-determined higher frequency.

4. The circuit of claim 3, wherein said second transmission line includes a plurality of electrically conductive pads that are electrically connected to each other.

5. The circuit of claim 1, wherein said first length of said first transmission line is about 90 electrical degrees.

6. The circuit of claim 1, wherein said first and second transmission lines have a high characteristic impedance.

7. The circuit of claim 1, wherein said first and second transmission lines are formed on a substrate in a microstrip configuration.

8. The circuit of claim 1, wherein the low impedance-to-ground structure includes a bypass capacitor.

9. The circuit of claim 1, wherein the low impedance-to-ground structure includes a direct current path to ground.

10. An oscillator, comprising:
   an active device including a port;
   a resonator coupled to said port for causing said active device to generate a first radio frequency energy cycling at a selected frequency; and
   a direct current (DC) biasing circuit comprising:
      a first transmission line having a first and second portions thereof, said first portion being connected to said port of said active device, wherein a first length between said first and second portions is about 90 electrical degrees or about an odd multiple thereof for a second radio frequency energy cycling at a pre-determined frequency;
      a low impedance structure coupled to said first transmission line by way of said second portion thereof; and
      a second transmission line coupled to said first transmission by way of about said first portion thereof, said second transmission line having a second length sufficient to increase the normalized impedance at said first portion of said first transmission line for said first radio frequency.

11. The oscillator of claim 10, wherein the resonator includes a dielectric resonator.

12. The oscillator of claim 11, wherein said pre-determined frequency is greater than said selected frequency, and second transmission line includes an opened end.

13. The oscillator of claim 12, wherein said second length of said second transmission line is adjustable for increasing said normalized impedance at said first portion of said first transmission line to other radio frequency energies having frequencies lower than said pre-determined higher frequency.

14. The oscillator of claim 13, wherein said second transmission line includes a plurality of conductive pads that are electrically connected to each other.

15. The oscillator of claim 10, wherein said first length of said first transmission line is about 90 electrical degrees.

16. The oscillator of claim 10, wherein said first and second transmission lines have a high characteristic impedance.

17. The oscillator of claim 10, wherein said first and second transmission lines are formed on a substrate in a microstrip configuration.

18. The oscillator of claim 10, wherein the low impedance structure includes a bypass capacitor.

19. The oscillator of claim 10, wherein the low impedance structure includes a direct current path to ground.

20. An oscillator for producing a first radio frequency energy cycling at a specified frequency, comprising:
   a field effect transistor (FET) having gate, drain and source ports;
   a resonator coupled to one of said gate, drain and source ports; and
   a FET gate return circuit for providing a direct current grounding to said gate port of said FET to improve a phase noise characteristic of said oscillator, comprising:
      a first transmission line having first and second portions thereof, said first portion being coupled to said gate port of said field effect transistor, said first transmission line having a first length between said first and second portions of about 90 degrees or about an odd multiple thereof for said specified frequency, said first transmission line having a characteristic impedance of at least about 80 Ohms;
      a shunted capacitor coupled to a second portion of said first transmission line; and
      a shunted resistor coupled to said second portion of said first transmission line and to a direct current ground terminal, said resistor having a resistance of at least about 10 kilo Ohms.

21. The oscillator of claim 20, wherein the resonator includes a dielectric resonator.

22. The oscillator of claim 20, wherein said dielectric resonator is coupled to said gate port of said field effect transistor by way of a second transmission line.

23. The oscillator of claim 22, wherein said dielectric resonator oscillator is spaced apart from and electromagnetically coupled to said second transmission line.

24. The oscillator of claim 23, further including an output impedance matching circuit coupled to the drain port of said field effect transistor.

25. The oscillator of claim 24, wherein said first and second transmission lines, output impedance matching circuit and dielectric resonator are disposed on a substrate in a microstrip configuration.

26. An oscillator for producing a first radio frequency energy cycling at a specified frequency, comprising:
   a field effect transistor having gate, drain and source ports;
   a resonator coupled to one of said gate, drain and source ports;
   a first transmission line having first and second portions thereof said first portion being coupled to said gate port of said field effect transistor, said first transmission line having a first length between said first and second portions of about 90 degrees or about an odd multiple thereof for said first radio frequency energy;
   a shunted capacitor coupled to a second portion of said first transmission line;
   a shunted resistor coupled to said second portion of said first transmission line; and
   a third transmission line coupled to said first transmission line at said first portion, said third transmission line having a second length sufficient to increase a normalized impedance at said first portion of said second transmission line for a second radio frequency energy cycling at another selected frequency that is lower than said selected frequency.

* * * * *